United States Patent [19]
Barr et al.

[11] Patent Number: 5,952,154
[45] Date of Patent: Sep. 14, 1999

[54] PHOTOIMAGEABLE COMPOSITION HAVING IMPROVED FLEXIBILITY

[75] Inventors: Robert Barr, Laguna Niguel; Daniel Lundy, Pomona; Stephen Wheeler, Irvine, all of Calif.

[73] Assignee: Morton International, Inc., Chicago, Ill.

[21] Appl. No.: 09/086,903

[22] Filed: May 29, 1998

[51] Int. Cl.$^6$ .................................................. G03F 7/033
[52] U.S. Cl. ........................... 430/284.1; 522/96; 522/97
[58] Field of Search ............................ 430/284.1; 522/96, 522/97

[56] References Cited

U.S. PATENT DOCUMENTS

| | | | |
|---|---|---|---|
| 3,953,309 | 4/1976 | Gilano et al. | 204/159.16 |
| 4,003,877 | 1/1977 | Lipson et al. | 260/47 UA |
| 4,245,030 | 1/1981 | Faust et al. | 430/281.1 |
| 4,499,163 | 2/1985 | Ishimaru et al. | 430/5 |
| 4,610,951 | 9/1986 | Lipson et al. | 430/313 |
| 4,695,527 | 9/1987 | Geissler et al. | 430/256 |
| 4,837,126 | 6/1989 | Lin | 430/284.1 |
| 4,877,711 | 10/1989 | Aoai et al. | 430/284.1 X |
| 5,102,774 | 4/1992 | Settachayanon | 430/284.1 |
| 5,217,845 | 6/1993 | Steppan | 430/281.1 |
| 5,254,432 | 10/1993 | Aoai | 430/192 |
| 5,341,799 | 8/1994 | Fifield et al. | 528/49 |
| 5,415,972 | 5/1995 | Mayes | 430/260 |
| 5,744,282 | 4/1998 | Ichikawa et al. | 430/284.1 |

FOREIGN PATENT DOCUMENTS 0738927  4/1996  European Pat. Off. .

OTHER PUBLICATIONS

Obara et al, 119:183010, English Abstract of Japanese Kokai Takkyo Koho 05–065323 dated Mar. 1993, Chemical Abstracts, ACS.

*Primary Examiner*—Cynthia Hamilton
*Attorney, Agent, or Firm*—Wayne E. Nacker; Gerald K. White

[57] ABSTRACT

The invention provides a negative-acting photoimageable composition comprising A) between about 30 and about 80 wt % based on total weight of A) plus B) of a binder polymer having acid functionality sufficient to render said photoimageable composition developable in alkaline aqueous solution, B) between about 20 and about 70 wt % based on total weight of A) plus B) of an addition-polymerizeable, non-gaseous α,β-ethylenically unsaturated compound(s) capable of forming a high polymer by free-radical initiated chain-propagating addition polymerization, at least about 50 mole percent of the α,β-ethylenically unsaturated moieties of B) being methacrylic moieties, and C) between about 0.1 and about 20 wt % based on total weigh of A) plus B) of a photoinitiator chemical system. Photopolymerizable component B comprises, at between about 1 and about 70 wt. % relative to total of A) plus B), a urethane oligomer having, in addition to α,β-ethylenic unsaturation, carboxylic acid functionality.

10 Claims, No Drawings

PHOTOIMAGEABLE COMPOSITION HAVING IMPROVED FLEXIBILITY

The present invention is directed to negative-acting photoimageable compositions such as those used as photoresists in the art of printed circuitry. The photoimageable composition contains, as a portion of its photoimageable component, a urethane oligomer which has acid functionality.

BACKGROUND OF THE INVENTION

This invention is directed to negative-acting photoimageable compositions which are developable in alkaline aqueous solutions. The invention is particularly applicable to primary photoimaging resists, but is applicable, as well, to compositions that are hardenable so as to form solder masks and the like.

A variety of such photoimageable compositions are described. Essential compositions of the type to which the present invention is directed are A) a binder polymer; B) photopolymerizable $\alpha,\beta$-ethylenically unsaturated compound(s), and C) between about 0.1 and about 20 wt % based on total weight of A) plus B) of a photoinitiator chemical system. The binder polymer A) has sufficient acid functionality, generally carboxylic acid functionality, that the binder polymer is soluble in alkaline aqueous solution and thereby renders the photoimageable composition developable in alkaline aqueous solutions. The photopolymerizeable compound(s) B) are monomers and/or short chain oligomers, a substantial portion of which have multiple $\alpha,\beta$-ethylenic unsaturated functionality.

The photoinitiator chemical system C) includes chemicals which generate free radicals upon exposure to actinic radiation. These free radicals propagate the polymerization of the $\alpha,\beta$-ethylenic unsaturated moieties of the photopolymerizeable compounds B). Herein, the photoinitiator system C) is deemed to include not only chemical compounds which generate free radicals, but catalysts or sensitizers which promote the free-radical initiated polymerization of the $\alpha,\beta$-ethylenic unsaturated moieties of the photopolymerizeable compounds B).

Circuit boards almost invariably have through-holes to connect circuitry on opposite faces of the board. With holes becoming larger on circuit boards, higher tenting strength is becoming increasingly important; thus greater flexibility of photoimageable compositions is required. Improved flexibility also contributes to an improved cross hatch adhesion which allows for better compatibility with automated polyester removal systems. If the photoresist is brittle, these polyester removal systems will cause chipping of the photoresist and subsequently, circuit line defects.

By replacing a portion of conventional photo reactive monomers (like ethoxylated trimethylolpropane triacrylate) with an isocyanuric, urethane-based oligomer, a significant improvement to tenting strength and flexibility was observed. However, even though the flexibility was noticeably better, the fine line adhesion was not improved and the oligomer was shown to be a major source of developing scumming.

Improved fine line adhesion and lower developer scum has been demonstrated when the isocyanuric oligomer is comprised of the product of a polyethoxymonomethacrylate and the isocyanurate trimer of hexamethylene diisocyanate, as described, for example, in European Patent Application EP 0 738927 A2 and Japanese Patent Document JP 08-2868372. The use of the product of a polyalkoxymonomethacrylate in UV-curable photoresists enhances the performance of such compositions over those made with urethane compounds based on the isocyanurate trimer of hexamethylene diisocyanate. Present day commercial requirements include further improvements to both fine line adhesion and developer scumming.

Herein, isocyanuric, urethane-based oligomers, as described above, are improved for use in the photoimageable composition by incorporating acid functionality. The acid functionality is found to minimize the developer scum by increasing the hydrophilic balance of the oligomer backbone. With the acid in the backbone, it is much easier to emulsify the entire oligomer molecule.

Along with improving the developer scum problem, it has been found that acid functional oligomers improve the fine line adhesion of the photoresist. This is likely achieved by the acid functionality causing faster development. The faster development results in the photoresist dwelling for a shorter period of time in the developing solution.

In addition to the improved adhesion and scumming, the acid functionality also contributes to a faster stripping time.

SUMMARY OF THE INVENTION

The present invention is directed to a negative-acting photoimageable composition comprises A) between about 30 and about 80 wt %, based on total weight of A) plus B) of an organic polymeric binder having sufficient acid functionality to render the photoimageable composition developable in alkaline aqueous solution, B) between about 20 and about 70 wt % based on total weight of A) plus B) of addition-polymerizeable, non-gaseous $\alpha,\beta$-ethylenically unsaturated compounds capable of forming a polymer by free-radical initiated chain-propagating addition polymerization, and C) between about 0.1 and about 20 wt % relative to total weight of A) plus B) of an organic, radiation-sensitive free-radical generating chemical system activatable by actinic radiation to initiate chain-propagating addition polymerization of the addition-polymerizeable material. In accordance with the invention, component B) comprises between about 20 and about 70 wt %, based on total weight of A) plus B) of a urethane oligomer having the general formula:

where X is a polyvalent aliphatic, cycloaliphatic or aromatic hydrocarbon moiety, a polyvalent isocyanurate, or a polyvalent biuret, where the R's are the same or different and are selected from:

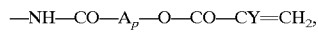

and

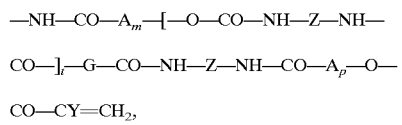

where m=0–25; p=1–25; t=0–1; and Y is H, $CH_3$, or $C_2H_5$, provided that at least one of the R's is the latter of these; the A's are the same or different and are selected from one or more of:

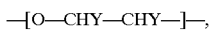

where the Y's are the same or different and are selected from

H, $CH_3$, or $C_2H_5$,

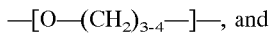, and

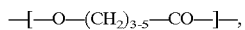, as either homopolymers or copolymers;

Z is a divalent alkyl or aromatic hydrocarbon moiety; and G has the general formula:

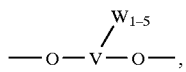

where V is an alkyl or aromatic hydrocarbon moiety and W is an acidic group selected from COOH, $SO_3H$, and $PO_3HR^1$, where $R^1$ is H or $C_{1-8}$ alkyl.

Where it is stated above that the A's are the same or different, it is meant that the A's may be the same or different in any one oligomer molecule or may be the same or different within any one R group. If the As are different within any one R group, the different A's may be randomly distributed or the different A's may be in blocks.

Preferably X is

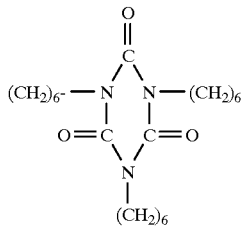

Preferably A is

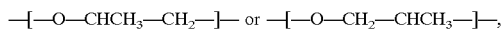

Preferably m=0.
Preferably t=0.
Preferably p=5–6.
Preferably Y=$CH_3$.
Preferably

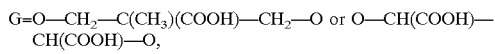

most preferably the former.
Preferably Z=$(CH_2)_6$.

DETAILED DESCRIPTION OF CERTAIN PREFERRED EMBODIMENTS

Herein, unless otherwise noted, all percentages are weight percentages. Component A) (the binder polymer) and Component B) (the photoimageable compounds) which are herein considered to equal 100 wt %, and other components, including the components of the photoinitiator chemical system, being based on total weight of A) plus B).

The invention is directed to photoimageable compositions which are developable in alkaline aqueous solution and which therefore have substantial acid functionality. Such photoimageable compositions typically have a binder A) having acid functionality, typically an acid number of at least about 80, preferably at least about 100 and more preferably about 150 or more, up to about 250. The acid functionality is typically carboxylic acid functionality, but may also include, for example, sulfonic acid functionality or phosphoric acid functionality. Binder polymers for photoimageable compositions typically have weight average molecular weights between about 20,000 and about 200,000, preferably at least about 80,000.

The polymers are typically derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acid and methacrylic acid, for example, methyl acrylate, 2-ethyl hexyl acrylate, n-butyl acrylate, n-hexyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

The amount of the binder polymer A) may vary over a wide range, typically comprising between about 30 to about 80 wt % of the composition based on total weight of A) plus B).

Examples of such polymers and photoimageable compositions using such polymers are found, in the following U.S. Pat. Nos: 3,953,309, 4,003,877, 4,610,951, and 4,695,527 the teaching of each of which are incorporated herein by reference.

The photopolymerizable component B) comprises between about 5 and about 100 wt %, preferably between about 25 and about 75 wt % of total amount of B), i.e., between about 1 and about 70 wt %, preferably between about 5 and about 52.5 wt % based on total weight of A) plus B), of the acid functional urethane oligomer described above, having photopolymerizable poly α,β-ethylenic unsaturation.

The balance of photopolymerizeable component B), i.e., between 0 and about 95 wt %, preferably between about 25 and about 75 wt % of B, i.e., between 0 and about 69 wt %, preferably between about 5 and about 52.5 wt %, relative to total of A) plus B) is typically a monomer, dimer or short chain oligomer having ethylenic unsaturation, particularly, α,β-ethylenic unsaturation, including monofunctional compounds and compounds having α,β-ethylenic unsaturation functionality 2 or greater. Typically, a mixture of monofunctional and multi-functional monomers will be used. Suitable photopolymerizeable compounds include, but are not limited to, the monomers recited above as suitable for forming binder polymers, particularly the non-acid functional compounds. The total amount of photopolymerizeable component B) is typically between about 20 and about 70 wt % of the photoimageable composition based on total weight of A) plus B).

To initiate polymerization of the monomers upon exposure to actinic radiation, the photoimageable composition contains a photoinitiator chemical system. Generally, the photoinitiator chemical system comprises between about 0.1 and about 20 wt % based on total weight of A) plus B). Photoinitiator chemicals include, but are not limited to 9-phenylacridine, n-phenyl glycine, aromatic ketones (benzophenone, N, N'-tetramethyl-4, 4'-diaminobenzophenone [Michier's ketone], N,N'-tetraethyl-4,4'-diaminobenzophenone,4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone, benzoins (benzoin, benzoinmethylether, benzoinethylether, benzoinisopropylether, benzoin-n-butylether, benzoin-phenylether, methylbenzoin, ethybenzoin, etc.), benzyl derivatives (dibenzyl, benzyldiphenyldisulfide, benzyldimethylketal (SIC), etc.), acridine derivatives (9-phenylacridine, 1,7-bis(9-acridinyl) heptane, etc.), thioxanthones (2-chlorothioxanthone, 2-methylthioxanthone, 2,4-diethylthioxanthone, 2,4-dimethylthioxanthone, 2-isopropylthioxanthone, etc.), acetophenones (1,1-dichloroacetophenone, p-t-butyldichloroacetophenone, 2,2-diethoxyacetophenone, 2,2-dimethoxy-2-phenylacetophenone, 2,2-dichloro-4-phenoxyacetophenone, etc.), etc.. Though, not a free-radical generator, triphenylphosphene may be included in the photoinitiator chemical system as a catalyst.

The photoimageable composition may advantageously include one or more plasticizers at between about 0.5 and about 10 wt % based on total weight of A) plus B). Examples of suitable plasticizers include, but are not limited to, phthalate esters (e.g., dibutylphthalate, diheptylphthalate, dioctylphthalate, diallylphthalate), glycols (e.g., polyethylene-glycol, polypropyleneglycol), glycol esters (e.g., triethylene-glycoldiacetate, tetraethyleneglycoldiacetate, dipropyleneglycol-dibenzoate), phosphate esters (tricresylphosphate, tripheynlphosphate), amides (p-toluenesulfoneamide, benzenesulfoneamide, N-n-butylacetoneamide), aliphatic dibasic acid esters (diisobutyl-adipate, dioctyladipate, dimethylsebacate, dioctylazelate, dibutylmalate, triethylcitrate, tributylcitrate, triethylacetylcitrate, tri-n-propylacetylcitrate, tri-n-butylacetylcitrate, butyl-laurate, dioctyl-4,5-diepoxycyclohexane-1,2-dicarboxylate, glycerinetriacetylesters.

Additionally, the photoimageable compositions may contain a wide variety of additional components as are known in the art, including additional polymers, such as those which might be used to effect a final hardened cure of a solder mask, dyes, color formers, stabilizers, flexibilizing agents, fillers etc.

Processing of the photoimageable composition is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

The invention provides a fine line (less than 75 microns) resist sidewall which adheres well to copper surfaces.

The invention will now be described in greater detail by way of specific examples.

EXAMPLE A (COMPARATIVE) AND B

A base photoimageable composition was formulated as follows:

| | Component | Wt %* |
|---|---|---|
| 1. | Terpolymer of methylmethacrylate, butylacrylate methylmethacrylic acid (Acid No. 150, wt. average molecular weight 80,000) | 56.7 |
| 2. | Ethoxylated bisphenol A dimethacrylate | 14.4 |
| 3. | Polypropylene glycol methacrylate | 12.2 |
| 4. | Urethane oligomer (A) or (B)** | 16.7 |
| 5. | p-toluene sulfonamide (plasticizer) | 5.0 |
| 6. | Triphenylmethane dye | 0.056 |
| 7. | 9-phenylacridine (photoinitiator) | 0.17 |

*Components 1–4 calculated as 100 wt %, remaining components calculated relative to components 1–4.
**The Urethane Oligomers have the general formulae:

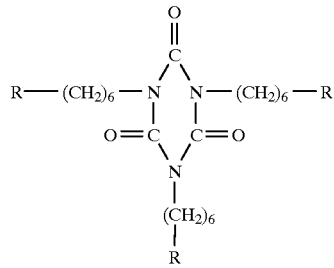

In urethane oligomer (A), the Rs have the formula:
NH—CO—O—(—CH$_2$—CH$_2$—O—)$_{5-6}$—CO—C(CH$_3$)=CH$_2$.
(Sold by International Specialties as PEM6E)
In urethane oligomer (B), the Rs have the formula:
NH—CO—O—CH$_2$—C(CH$_3$)(COOH)—CH$_2$—O—CO—NH—(CH$_2$)$_6$—NH—CO—O—(—CH(CH$_3$)—CH$_2$)—O—)$_{5-6}$—CO—C(CH$_3$)=CH$_2$.

The acid-functional urethane oligomer of Example (B) is synthesized as follows.

Into a clean 1 liter flask are charged 0.212 liters of dimethylformamide, 67.0 grams of dimethyolpropionic acid (DMPA), and 215 ppm (based on DMPA solids) dibutyltin dilaurate (DBTDL). Under dry nitrogen blanket, the mixture was heated to 48° C. with mild agitation. 96.75 grams of 1,6-hexamethylene diisocyanaurate trimer was added over a 1½ hour period, keeping the temperature at between 55° C. and 60° C. Temperature was maintained for one additional hour with mixing and then the solution was cooled to 20° C., and sealed under a dry nitrogen blanket.

In a separate clean, dry 2 liter flask were charged 0.212 liters of dimethylformamide, 88.2 grams of 1,6-hexamethylene diisocyanate (HDI) and 171 ppm DBTDL (based on HDI solids). Under dry air, the mixture was heated to 50° C. with mild agitation. To this mixture was added in a dropwise manner, a solution of 174 grams of polypropoxymonomethacrylate (348 weight per equivalent hydroxyl) and 0.55 grams of octadecyl 3,5-di-tert-butyl-4-hydroxycinnamate, keeping the temperature between 50° C. and 55° C., then holding at that temperature for an additional 1 hour. The reaction product of the DMPA and the HDI isocyanurate trimer (above) was then slowly added over a 1½ hour period maintaining a 40°–45° C. temperature, after which the entire mixture was held at this temperature range for an additional 1½ hours, then cooled to 20° C. and sealed under dry air.

Properties of the photoimageable compositions are given in Table 1 below:

TABLE 1

| Urethane Oligomer Component(8) | Ethoxylated trimethacrylate urethane of HDI isocyanurate(A) | Acid-modified propoxylated trimethacrylate urethane of HDI isocyanurate(B) |
|---|---|---|
| Exposure Energy for a Step 7 (mj.) | 28 | 22 |
| Exposure Energy for a Step 9 (mj.) | 48 | 38 |
| Resolution(1) at Step 7(2) and 2x Break point(3) | 42 | 44 |
| Resolution(1) at Step 7(2) and 4x Break point(3) | 33 | 34 |
| Resolution at Step 9(2) and 4x Break point | 50 | 58 |
| Adhesion(1) at Step 7(2) and 4x Break point | 36 | 45 |
| Adhesion(1) at Step 9(2) and 4x Break point | 25 | 30 |
| Cross hatch(9) at Step 7, 2x Break Point(3) | 4.5 | 5 |
| Cross Hatch(9) at Step 9, 2x Break Point(3) | 3.5 | 5 |
| Stripping Time(7) at Step 7(2), after etch | 48 | 25 |
| Stripping Time(7) at Step 9(2), after etch | 52 | 29 |
| Reactivation(10) | 3 | 4 |
| Stripping Time(7) at Step 9(2), after plating in Tin | 50.4 | 34.2 |

(1)Minimum observed in microns, resolution as equal lines and spaces, adhesion as lines with a 400 micron spacing.
(2)Stouffer 21 solid step
(3)Developing at 30° C. in 1% sodium carbonate monohydrate
(4)Puncture strength with a 2 mm radius tipped probe through a tented 6 mm hole
(5)Hot air knife dried after developing and held at room temperature, 30% RH for 16 hours
(6)After 4 minute immersion in 20° C. tap water
(7)In seconds, conveyorized spray with 55° C. 3% sodium hydroxide solution
(8)As a 15% by weight component of 38 micron thick dry film photoresist formulation See above structural formulae for (A) and (B)
(9)By ASTM D714, 5 = best
(10)After flash plating in tin, 5 = best Particularly noteworthy are the reduction in exposure energy, improved cross-hatch adhesion, and shorter stripping time.

What is claimed is:

1. A negative-acting photoimageable composition comprising

A) between about 30 and about 80 wt % based on total weight of A) plus B) of a binder polymer having acid functionality sufficient to render said photoimageable composition developable in alkaline aqueous solution, B) between about 20 and about 70 wt % based on total weight of A) plus B) of an addition-polymerizable, non-gaseous α,β-ethylenically unsaturated compound (s) capable of forming a high polymer by free-radical initiated chain-propagating addition polymerization, said component B comprising between about 1 and about 70 wt % relative to total weight of A) plus B) of a urethane oligomer having the formula:

where X is a polyvalent aliphatic, cycloaliphatic or aromatic hydrocarbon moiety, a polyvalent isocyanurate, or a polyvalent biuret, where the R's are the same or different and are selected from:

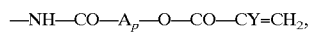

and

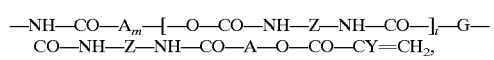

where m=0–25; p=1–25; t=0–1; and Y is H, CH$_3$, or C$_2$H$_5$, provided that at least one of the R's is the latter of these; the A's are the same or different and are selected from one or more of:

where the Y's are the same or different and are selected from

H, CH$_3$, or C$_2$H$_5$,

—[O—(CH$_2$)$_{3-4}$—]—, and

—[—O—(CH$_2$)$_{3-5}$—CO—]—, as either homopolymers or copolymers;

Z is a divalent alkyl or aromatic hydrocarbon moiety; and G has the general formula:

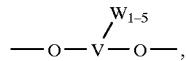

C) between about 0.1 and about 20 wt % based on total weight of A) plus B) of a photoinitiator chemical system.

2. The composition according to claim 1 wherein X is

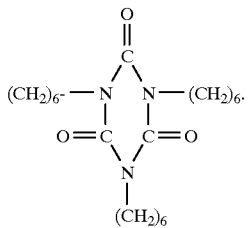

3. The composition according to claim 1 wherein A is

or

4. The composition according to claim 1 wherein m=0.
5. The composition according to claim 1 wherein t=0.
6. The composition according to claim 1 wherein p=5–6.
7. The composition according to claim 1 wherein Y=CH$_3$.
8. The composition according to claim 1 wherein G=O—CH$_2$—C(CH$_3$)(COOH)—CH$_2$—O.
9. The composition according to claim 1 wherein G=O—CH(COOH)—CH(COOH)—O.
10. The composition according to claim 1 wherein

Z=(CH$_2$)$_6$.

* * * * *